US008612667B2

(12) United States Patent
Lin et al.

(10) Patent No.: US 8,612,667 B2
(45) Date of Patent: Dec. 17, 2013

(54) METHOD FOR PERFORMING DATA PATTERN MANAGEMENT REGARDING DATA ACCESSED BY A CONTROLLER OF A FLASH MEMORY, AND ASSOCIATED MEMORY DEVICE AND CONTROLLER THEREOF

(75) Inventors: Ching-Hui Lin, Taipei (TW);
Kuo-Liang Yeh, Hsinchu County (TW);
Ken-Fu Hsu, Hsinchu County (TW)

(73) Assignees: Silicon Motion Inc., keji Chuangyeyuan, Tianan Digital, Futian, Shenzhen, Guangdong (CN); Silicon Motion Inc., Jhubei, Hsinchu County (TW)

( * ) Notice: Subject to any disclaimer, the term of this patent is extended or adjusted under 35 U.S.C. 154(b) by 890 days.

(21) Appl. No.: 12/647,555

(22) Filed: Dec. 28, 2009

(65) Prior Publication Data
US 2011/0016263 A1   Jan. 20, 2011

(30) Foreign Application Priority Data
Jul. 20, 2009   (TW) ................................ 98124411 A

(51) Int. Cl.
*G06F 12/00*   (2006.01)
(52) U.S. Cl.
USPC .................................. 711/103; 711/E12.007
(58) Field of Classification Search
None
See application file for complete search history.

(56) References Cited

U.S. PATENT DOCUMENTS

| | | | | |
|---|---|---|---|---|
| 5,799,168 | A * | 8/1998 | Ban | 711/103 |
| 6,510,490 | B2 * | 1/2003 | Fuma et al. | 711/113 |
| 6,810,500 | B1 * | 10/2004 | Chang | 714/763 |
| 6,978,412 | B1 * | 12/2005 | Reents et al. | 714/746 |
| 7,062,332 | B2 * | 6/2006 | Matsuda | 700/19 |
| 7,076,667 | B1 * | 7/2006 | Gama et al. | 713/193 |
| 7,444,577 | B2 * | 10/2008 | Best et al. | 714/745 |
| 7,467,407 | B2 * | 12/2008 | Yen | 726/20 |

(Continued)

OTHER PUBLICATIONS

Ammar et al., (Random Data Encryption Algorithm), Twenty Second National Radio Science Conference (NRSC 2005), Mar. 15-17, 2005, Cairo-Egypt, pp. 1-8, http://ieeexplore.ieee.org/stamp/stamp.jsp?tp=&arnumber=1502152.*

(Continued)

*Primary Examiner* — Edward Dudek, Jr.
*Assistant Examiner* — Christopher Birkhimer
(74) *Attorney, Agent, or Firm* — Winston Hsu; Scott Margo

(57) ABSTRACT

A method for performing data pattern management regarding data accessed by a controller of a Flash memory includes: when the controller receives a write command, generating a first random function, where the write command is utilized for instructing the controller to write the data into the Flash memory; and adjusting a plurality of bits of the data bit by bit to generate a pseudo-random bit sequence, and writing the pseudo-random bit sequence into the Flash memory to represent the data, whereby data pattern distribution of the data is adjusted. An associated memory device and the controller thereof are also provided, where the controller includes: a ROM arranged to store a program code; a microprocessor arranged to execute the program code to control the access to the Flash memory and manage a plurality of blocks; and a randomizer arranged to generate a random function. The controller can perform data pattern management.

10 Claims, 8 Drawing Sheets

(56) References Cited

U.S. PATENT DOCUMENTS

| | | |
|---|---|---|
| 2001/0025334 A1* | 9/2001 | Fuma et al. .................. 711/113 |
| 2001/0025340 A1* | 9/2001 | Marchant ..................... 713/150 |
| 2002/0196935 A1* | 12/2002 | Wenocur et al. .............. 380/37 |
| 2004/0221130 A1* | 11/2004 | Lai et al. ...................... 711/203 |
| 2006/0242486 A1* | 10/2006 | Kim et al. .................... 714/715 |
| 2007/0033338 A1* | 2/2007 | Tsern ............................ 711/106 |
| 2007/0033339 A1* | 2/2007 | Best et al. .................... 711/106 |
| 2007/0094438 A1* | 4/2007 | Ando et al. ...................... 711/2 |
| 2007/0189534 A1* | 8/2007 | Wood et al. .................. 380/255 |
| 2008/0133832 A1* | 6/2008 | Bhavnani ..................... 711/115 |
| 2008/0148001 A1* | 6/2008 | Gehrmann et al. ........... 711/164 |
| 2008/0151618 A1* | 6/2008 | Sharon et al. ............ 365/185.02 |
| 2008/0215798 A1 | 9/2008 | Sharon |
| 2008/0244154 A1* | 10/2008 | Jaquette et al. .................. 711/4 |
| 2008/0301775 A1* | 12/2008 | Ollikainen et al. ............... 726/3 |

OTHER PUBLICATIONS

Webopedia, (Solid State Disk), Aug. 9, 2002, pp. 1-2, http://web.archive.org/web/20020809141838/http://www.webopedia.com/TERM/S/solid_state_disk.html.*

Webopedia, (PCMCIA), Aug. 17, 2000, pp. 1-2, http://web.archive.org/web/20000817115700/http://www.webopedia.com/TERM/P/PCMCIA.html.*

* cited by examiner

| Address | Key |
|---|---|
| 0x00000000 | 0100 |
| 0x00000001 | 0010 |
| 0x00000010 | 0001 |
| ⋮ | |

FIG. 6

METHOD FOR PERFORMING DATA PATTERN MANAGEMENT REGARDING DATA ACCESSED BY A CONTROLLER OF A FLASH MEMORY, AND ASSOCIATED MEMORY DEVICE AND CONTROLLER THEREOF

BACKGROUND OF THE INVENTION

1. Field of the Invention

The present invention relates to access to a Flash memory, and more particularly, to a method for performing data pattern management regarding data accessed by a controller of a Flash memory, and to an associated memory device and a controller thereof.

2. Description of the Prior Art

As technologies of Flash memories progress in recent years, many kinds of portable memory devices, such as memory cards respectively complying with SD/MMC, CF, MS, and XD standards, are widely implemented in various applications. Therefore, the control of access to Flash memories in these portable memory devices has become an important issue.

Taking NAND Flash memories as an example, they can mainly be divided into two types, i.e. Single Level Cell (SLC) Flash memories and Multiple Level Cell (MLC) Flash memories. Each transistor that is considered a memory cell in SLC Flash memories only has two charge levels that respectively represent a logical value 0 and a logical value 1. In addition, the storage capability of each transistor that is considered a memory cell in MLC Flash memories can be fully utilized. More specifically, the voltage for driving memory cells in the MLC Flash memories is typically higher than that in the SLC Flash memories, and different voltage levels can be applied to the memory cells in the MLC Flash memories in order to record information of two bits (e.g. binary values 00, 01, 11, or 10) in a transistor that is considered a memory cell. Theoretically, the storage density of the MLC Flash memories may reach twice the storage density of the SLC Flash memories, which is considered good news for NAND Flash memory manufacturers who encountered a bottleneck of NAND Flash technologies.

As MLC Flash memories are cheaper than SLC Flash memories, and are capable of providing higher capacity than SLC Flash memories while the space is limited, MLC Flash memories have been a main stream for implementation of most portable memory devices on the market. However, various problems of the MLC Flash memories have arisen due to their unstable characteristics. In order to ensure that the access control of a portable memory device over the Flash memory therein can comply with related standards, the controller of the Flash memory should have some handling mechanisms in order to properly handle its data access operations.

According to the related art, the portable memory device having the aforementioned handling mechanisms may still suffer from some deficiencies. For example, due to usage behaviors of the user, data of some specific data patterns would probably be constantly written into the Flash memory, where these specific data patterns may easily cause errors such as write/program errors, read errors, etc. Therefore, a novel method is required for performing data pattern management regarding data accessed by the controller in order to reduce the probability of error occurrence.

SUMMARY OF THE INVENTION

It is therefore an objective of the claimed invention to provide a method for performing data pattern management regarding data accessed by a controller of a Flash memory, and to provide an associated memory device and a controller thereof, in order to solve the above-mentioned problem.

According to a preferred embodiment of the claimed invention, a method for performing data pattern management regarding data accessed by a controller of a Flash memory comprises: when the controller receives a write command, generating a first random function, wherein the write command is utilized for instructing the controller to write the data into the Flash memory; and adjusting a plurality of bits of the data bit by bit according to a sequence of the first random function to generate a pseudo-random bit sequence, and writing the pseudo-random bit sequence into the Flash memory to represent the data, whereby data pattern distribution of the data is adjusted.

While the method mentioned above is disclosed, an associated memory device is further provided. The memory device comprises: a Flash memory comprising a plurality of blocks; and a controller arranged to access the Flash memory and manage the plurality of blocks, and further perform data pattern management regarding data accessed by the controller itself In addition, the controller comprises a randomizer arranged to generate a first random function when the controller receives a write command, wherein the write command is utilized for instructing the controller to write the data into the Flash memory. Additionally, the controller adjusts a plurality of bits of the data bit by bit according to a sequence of the first random function to generate a pseudo-random bit sequence, and writes the pseudo-random bit sequence into the Flash memory to represent the data, whereby data pattern distribution of the data is adjusted.

While the method mentioned above is disclosed, a controller of a memory device is further provided, wherein the controller is utilized for accessing a Flash memory comprising a plurality of blocks. The controller comprises: a read only memory (ROM) arranged to store a program code; a microprocessor arranged to execute the program code to control access to the Flash memory and manage the plurality of blocks; and a randomizer arranged to generate a first random function when the controller receives a write command, wherein the write command is utilized for instructing the controller to write data into the Flash memory. In addition, the controller adjusts a plurality of bits of the data bit by bit according to a sequence of the first random function to generate a pseudo-random bit sequence, and writes the pseudo-random bit sequence into the Flash memory to represent the data, whereby data pattern distribution of the data is adjusted.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6 illustrates a look-up table utilized by the key generator shown in FIG. 5 according to an embodiment of the present invention.

DETAILED DESCRIPTION

Figure 1:
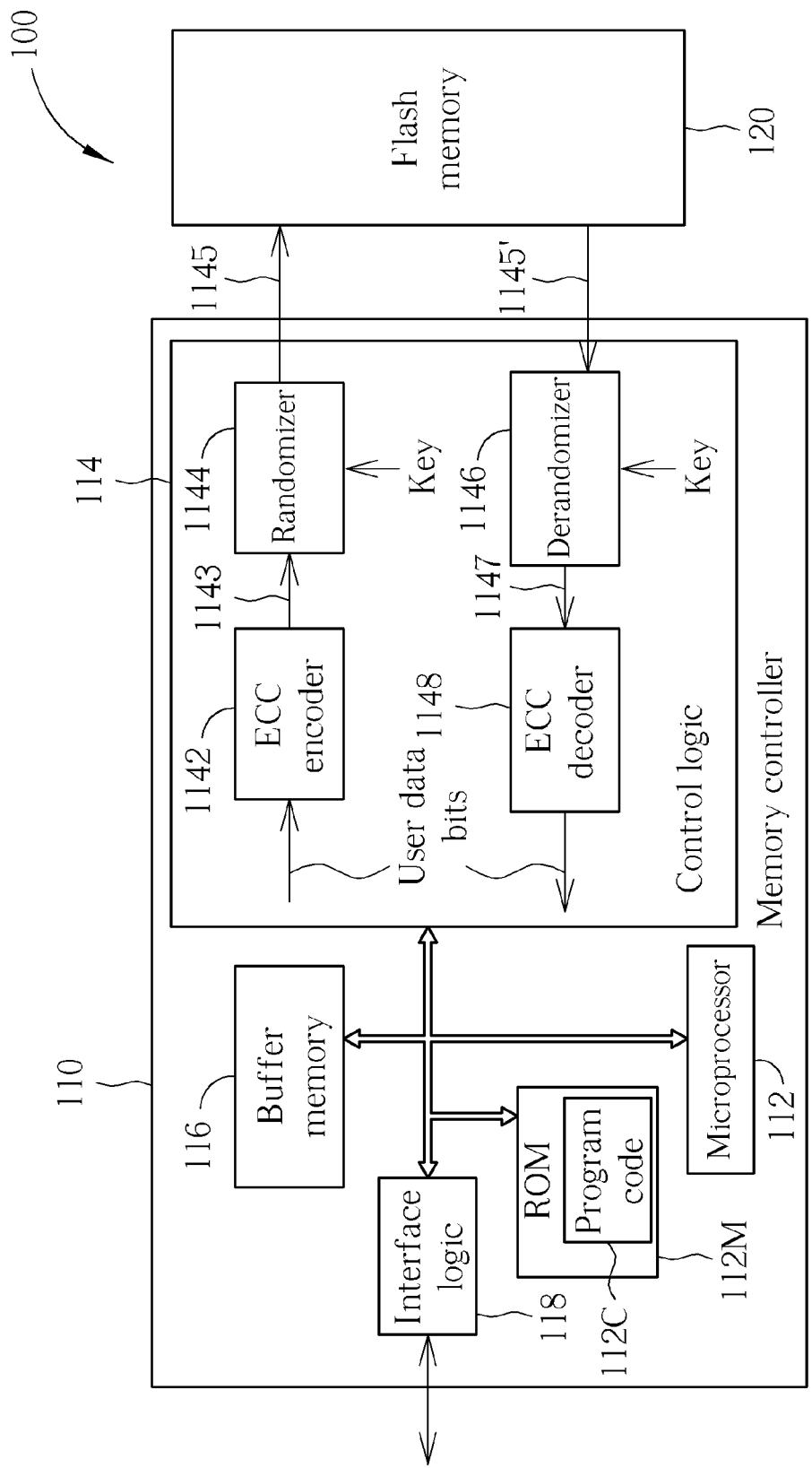
FIG. 1 is a diagram of a memory device according to a first embodiment of the present invention.

Please refer to FIG. 1, which illustrates a diagram of a memory device 100 according to a first embodiment of the present invention. In particular, the memory device 100 of this embodiment is a portable memory device, examples of which may include, but not limited to, memory cards complying with SD/MMC, CF, MS, or XD standards, and Universal Serial Bus (USB) Flash drives (which can be referred to as USB Flash disks). The memory device 100 comprises a Flash memory 120, and further comprises a controller arranged to access the Flash memory 120, where the aforementioned controller of this embodiment is a memory controller 110. According to this embodiment, the memory controller 110 comprises a microprocessor 112, a read only memory (ROM) 112M, a control logic 114, a buffer memory 116, and an interface logic 118. In addition, the control logic 114 comprises an Error Correction Code (ECC) encoder 1142, a randomizer 1144, a derandomizer 1146, and an ECC decoder 1148.

In this embodiment, the ROM 112M is arranged to store a program code 112C, and the microprocessor 112 is arranged to execute the program code 112C to control the access to the Flash memory 120. Typically, the Flash memory 120 comprises a plurality of blocks, and the controller (e.g. the memory controller 110 that executes the program code 112C by utilizing the microprocessor 112) performs data erasure operations on the Flash memory 120 by erasing in units of blocks. In addition, a block can be utilized for recording a specific amount of pages, where the controller mentioned above performs data writing operations on the Flash memory 120 by writing/programming in units of pages.

In practice, the memory controller 110 that executes the program code 112C by utilizing the microprocessor 112 is capable of performing various control operations by utilizing the internal components within the memory controller 110. For example, the memory controller 110 utilizes the control logic 114 to control access to the Flash memory 120 (e.g. operations of accessing at least one block or at least one page), utilizes the buffer memory 116 to perform buffering operations for the memory controller 110, and utilizes the interface logic 118 to communicate with a host device. According to this embodiment, in addition to accessing the Flash memory 120, the memory controller 110 is capable of properly managing the plurality of blocks.

In addition, the memory controller 110 can further perform data pattern management regarding data accessed by the memory controller 110 itself. In this embodiment, the ECC encoder 1142 performs ECC encoding on user data (e.g. the "user data bits" input into the ECC encoder 1142) to generate encoded data as the data (which means the ECC encoder 1142 generates the encoded data as a representative of the aforementioned data), where the encoded data comprises the user data mentioned above, Parity of the Inner Code, and Parity of the Outer Code, which are all input into the randomizer 1144 through the encoded data bit sequence 1143. Please refer to FIG. 2 for further details of the data pattern management performed by the memory controller 110.

Figure 2:
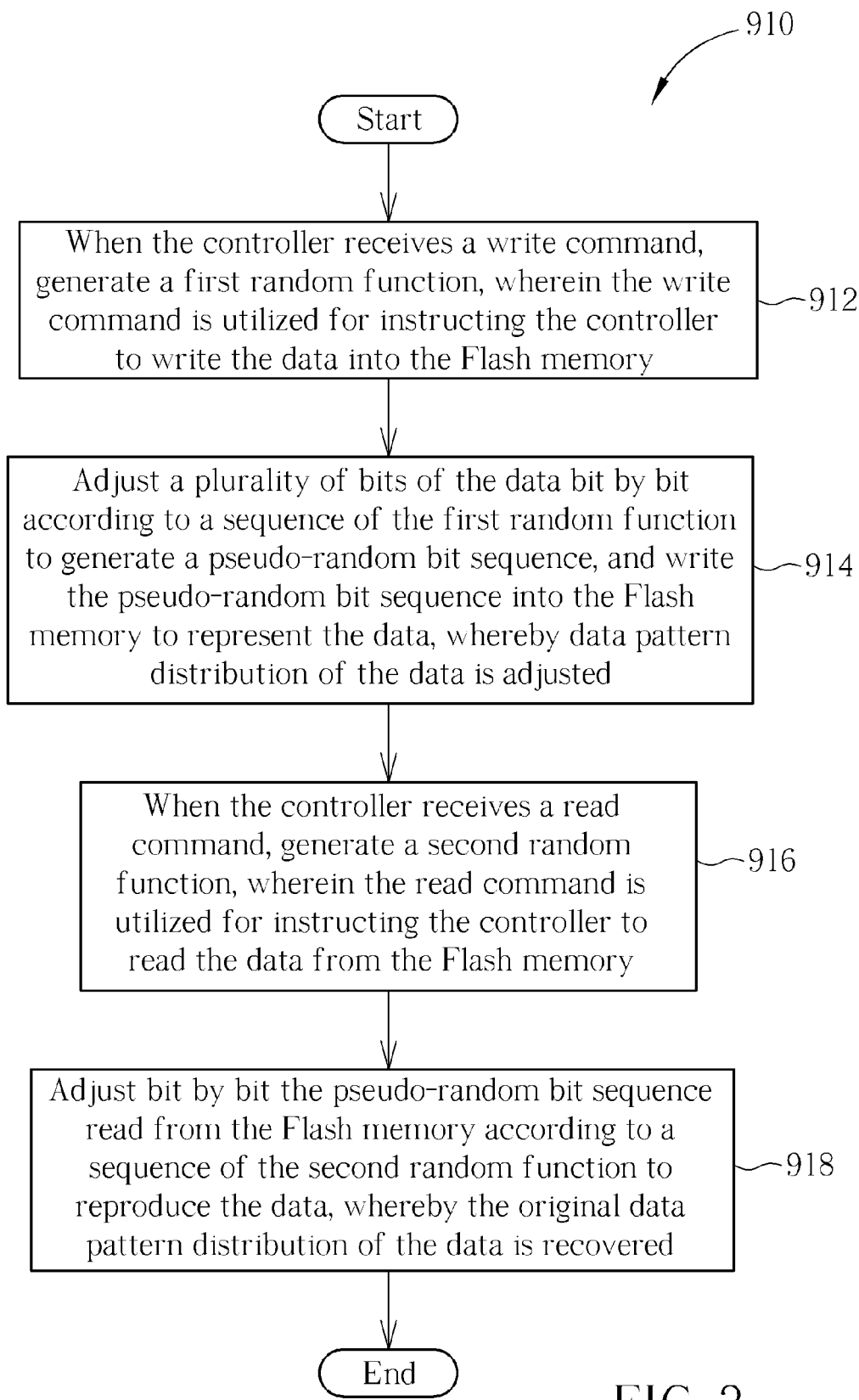
FIG. 2 is a flowchart of a method for performing data pattern management regarding data accessed by a controller of a Flash memory according to one embodiment of the present invention.

FIG. 2 is a flowchart of a method 910 for managing a plurality of blocks of a Flash memory according to one embodiment of the present invention. The method can be applied to the memory device 100 shown in FIG. 1, and more particularly, to the controller mentioned above (e.g. the memory controller 110 that executes the program code 112C by utilizing the microprocessor 112). In addition, the method can be implemented by utilizing the memory device 100 shown in FIG. 1, and more particularly, by utilizing the controller mentioned above. The method 910 is described as follows.

In Step 912, when the controller receives a write command, the randomizer 1144 generates a first random function, wherein the write command is utilized for instructing the controller to write the data into the Flash memory 120.

In Step 914, the controller (and more particularly, the randomizer 1144 therein) adjusts a plurality of bits of the data (e.g. the encoded data bit sequence 1143) bit by bit according to a sequence of the first random function to generate a pseudo-random bit sequence 1145, and writes the pseudo-random bit sequence 1145 into the Flash memory 120 to represent the data, whereby data pattern distribution of the data is adjusted, where an adjusted version of the data pattern distribution is more uniform than an original version of the data pattern distribution. This is for illustrative purposes only, and is not meant to be a limitation of the present invention. According to a variation of this embodiment, the randomizer 1144 can be installed outside the control logic 114, where an adder for injecting the sequence of the first random function and adjusting the encoded data bit sequence 1143 accordingly is installed between the encoded data bit sequence 1143 and the pseudo-random bit sequence 1145.

In Step 916, when the controller receives a read command, the derandomizer 1146 generates a second random function, wherein the read command is utilized for instructing the controller to read the data from the Flash memory 120.

In Step 918, the controller (and more particularly, the derandomizer 1146 therein) adjusts bit by bit the pseudo-random bit sequence read from the Flash memory 120 (i.e. the pseudo-random bit sequence 1145' that the derandomizer 1146 reads from the Flash memory 120) according to a sequence of the second random function to reproduce the data (e.g. the recovered data bit sequence 1147), whereby the original data pattern distribution of the data is recovered (i.e. the original version of the data pattern distribution of the data is recovered). This is for illustrative purposes only, and is not meant to be a limitation of the present invention. According to a variation of this embodiment, the derandomizer 1146 can be installed outside the control logic 114, where an adder for injecting the sequence of the second random function and adjusting the pseudo-random bit sequence 1145' accordingly is installed between the pseudo-random bit sequence 1145' and the recovered data bit sequence 1147.

As the derandomizer 1146 has already recovered the original data pattern distribution of the data in Step 918, the ECC decoder 1148 can perform ECC decoding according to the user data, the Parity of the Inner Code, and the Parity of the Outer Code, which are represented by the recovered data bit sequence 1147, to obtain the decoded user data (e.g. the "user data bits" output from the ECC decoder 1148).

Figure 3:
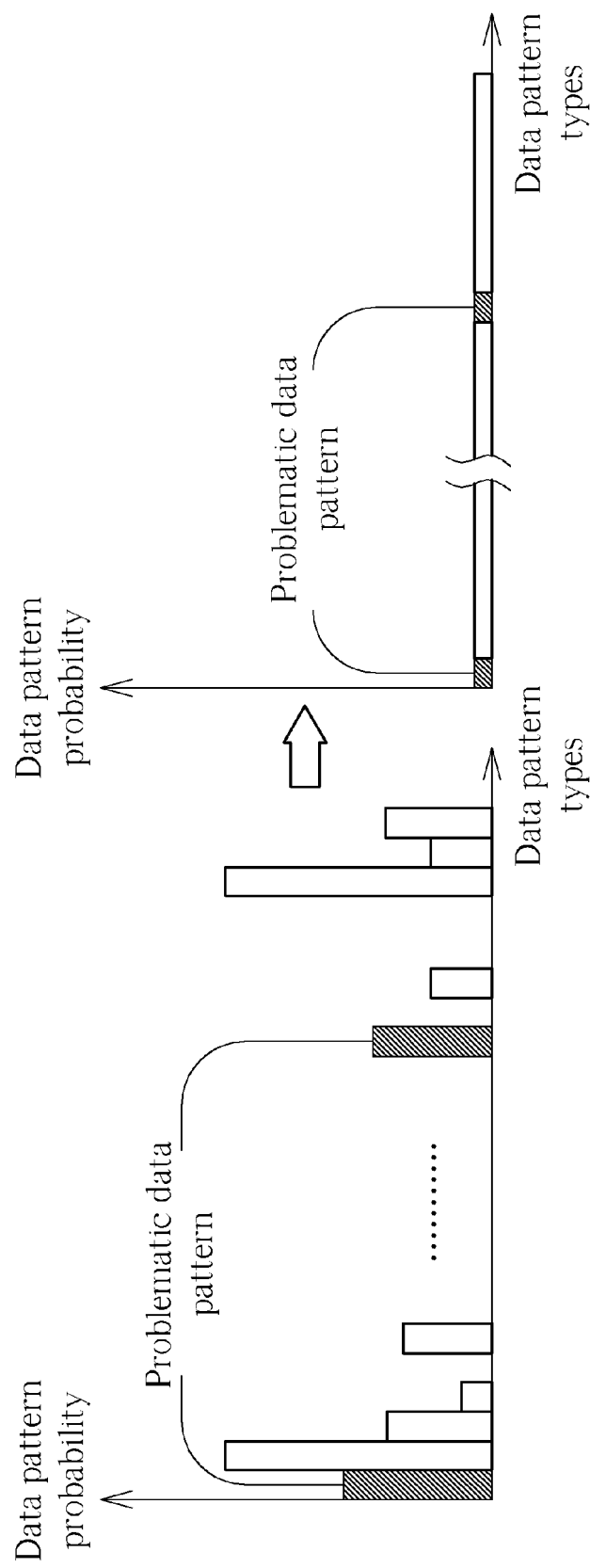
FIG. 3 is a diagram illustrating data pattern management involved with the method shown in FIG. 2 according to an embodiment of the present invention.

FIG. 3 is a diagram illustrating the data pattern management involved with the method shown in FIG. 2 according to an embodiment of the present invention. The left half and the right half of FIG. 3 may respectively represent the original version and the adjusted version of the data pattern distribution mentioned in Step 914, where the horizontal axis represents the data pattern types, and the vertical axis represents the data pattern probability. After Step 918 is executed, the derandomizer 1146 has recovered the original data pattern distribution of the data, as shown in the left half of FIG. 3.

Please note that the adjusted version of the data pattern distribution is more uniform than the original version of the data pattern distribution. In a situation where the number of data pattern types is pretty large, the average of the data pattern probability approaches zero. In addition, before the adjustment of Step 914, the problematic data patterns shown in the left half of FIG. 3 (i.e. the shaded portions in the left half of FIG. 3) originally have pretty high relative probability densities. After the adjustment of Step 914, the relative probability densities of these problematic data patterns are decreased as shown in the right half of FIG. 3. Therefore, in contrast to the related art, in a situation where some specific data patterns are likely to cause errors (e.g. write/program errors, read errors, etc.), when data of these specific data patterns are constantly written into the Flash memory 120 due to usage behaviors of the user, the present invention method and the associated memory device and the controller thereof can greatly decrease the error rate of data access.

According to an embodiment of the present invention, and more particularly, a special case of the first embodiment, the controller comprises at least one Linear Feedback Shift Register (LFSR) for generating at least one random function. For example, the memory controller 110 comprises two LFSRs respectively installed in the randomizer 1144 and the derandomizer 1146, where each of the randomizer 1144 and the derandomizer 1146 comprises a LFSR. According to this embodiment, each of the two LFSRs comprises at least one switch to form at least one programmable LFSR such as the programmable LFSR 410 shown in FIG. 4A. This is for illustrative purposes only, and is not meant to be a limitation of the present invention. According to a variation of this embodiment, the randomizer 1144 and the derandomizer 1146 may share the same LFSR.

In practice, the programmable LFSR 410 comprises a plurality of adders 412-1, 412-2, 412-3, and 412-4, a plurality of registers 414-0, 414-1, 414-2, 414-3, and 414-4, and a plurality of switches 416-1, 416-2, 416-3, and 416-4. The adders 412-1, 412-2, 412-3, and 412-4 can be modulo 2 adders. Please note that, in an initial state, the registers 414-0, 414-1, 414-2, 414-3, and 414-4 store a series of values {0, 1, 0, 1, 0}, which are respectively labeled in these registers. This is for illustrative purposes only, and is not meant to be a limitation of the present invention. According to other variations of this embodiment, in an initial state, the registers 414-0, 414-1, 414-2, 414-3, and 414-4 may store other values.

In addition, each switch of the programmable LFSR 410 is installed on a linear combination path of the programmable LFSR 410. The memory controller 110 inputs at least one key into the switches of the programmable LFSR 410, in order to utilize the key to set the linear combination paths of the programmable LFSR 410. According to this embodiment, the switches 416-1, 416-2, 416-3, and 416-4 switch according to switching signals SW-1, SW-2, SW-3, and SW-4 corresponding to the key, respectively. When a switching signal SW-n received by a switch 416-n (n=1, 2, 3, or 4) corresponds to a turn-on state (e.g. in a situation where the switching signal SW-n carries a logical value 1, which can be denoted as "SW-n=1"), the switch 416-n turns on the linear combination path where it is positioned, i.e. the feedback path from the output terminal of the register 414-n to the adder 412-n; otherwise, (i.e. the switching signal SW-n corresponds to a turn-off state, e.g. in a situation where the switching signal SW-n carries a logical value 0, which can be denoted as "SW-n=0"), the switch 416-n turns off the linear combination path where it is positioned. Therefore, by changing the key input into the programmable LFSR 410, the memory controller 110 can set the linear combination paths of the programmable LFSR 410 once and once again and change the architecture of the programmable LFSR 410.

Figure 4A:
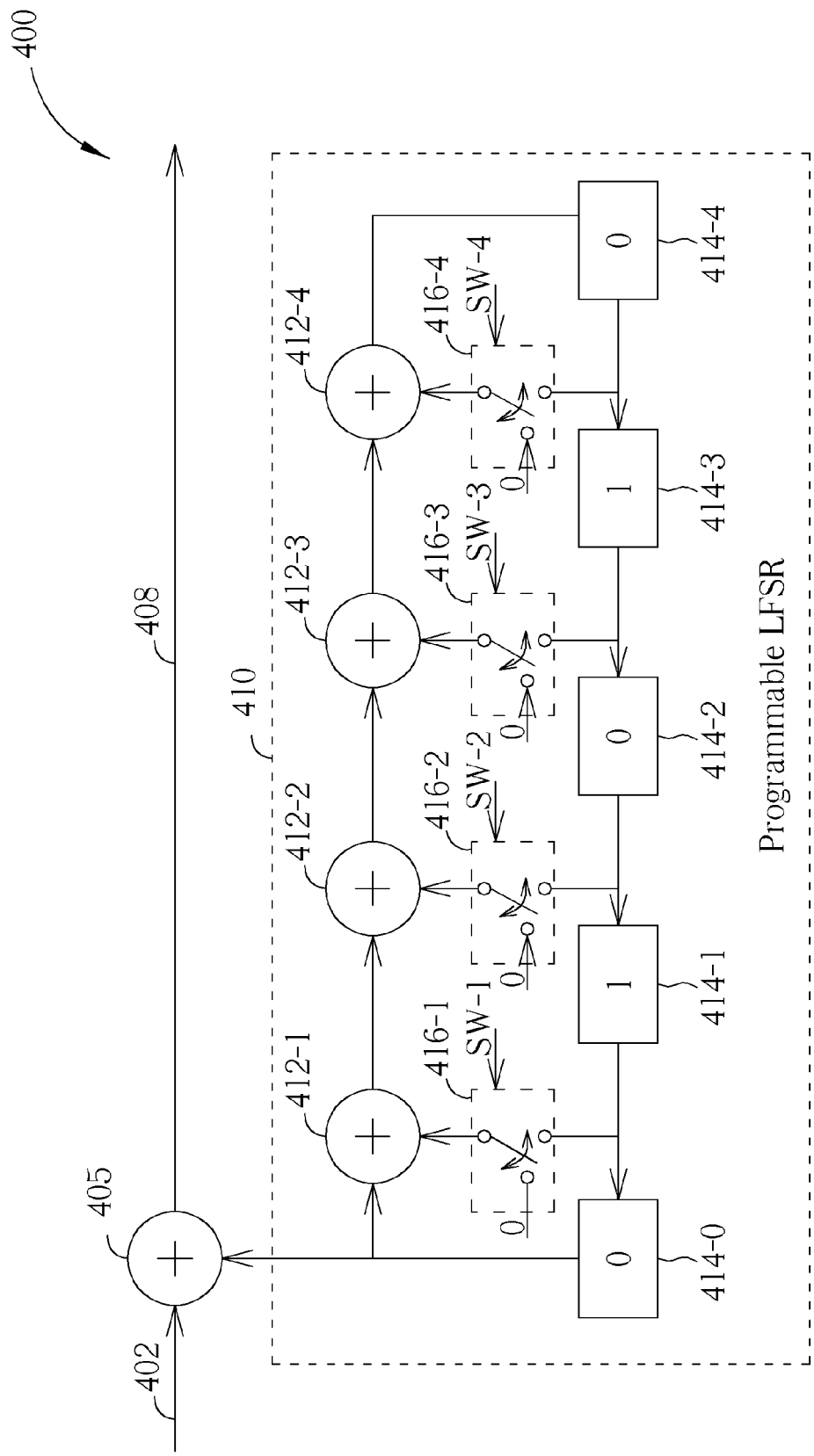
FIGS. 4A-4C illustrate programmable Linear Feedback Shift Registers (programmable LFSRs) utilized by the memory device shown in FIG. 1 according to respective embodiments of the present invention, where the programmable LFSRs of these embodiments can be applied to the randomizer or the derandomizer shown in FIG. 1.
Figure 4B:
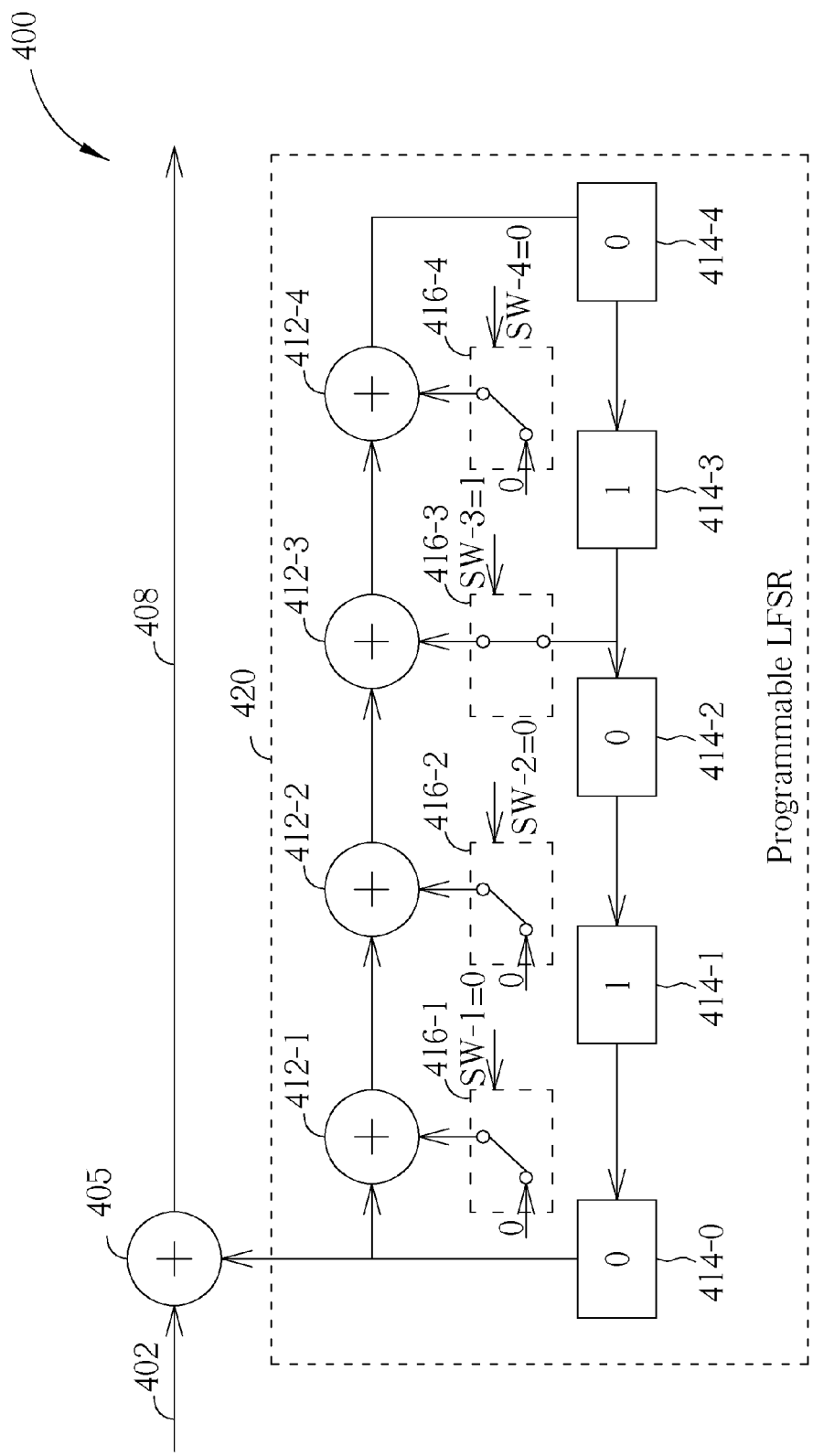
Figure 4C:
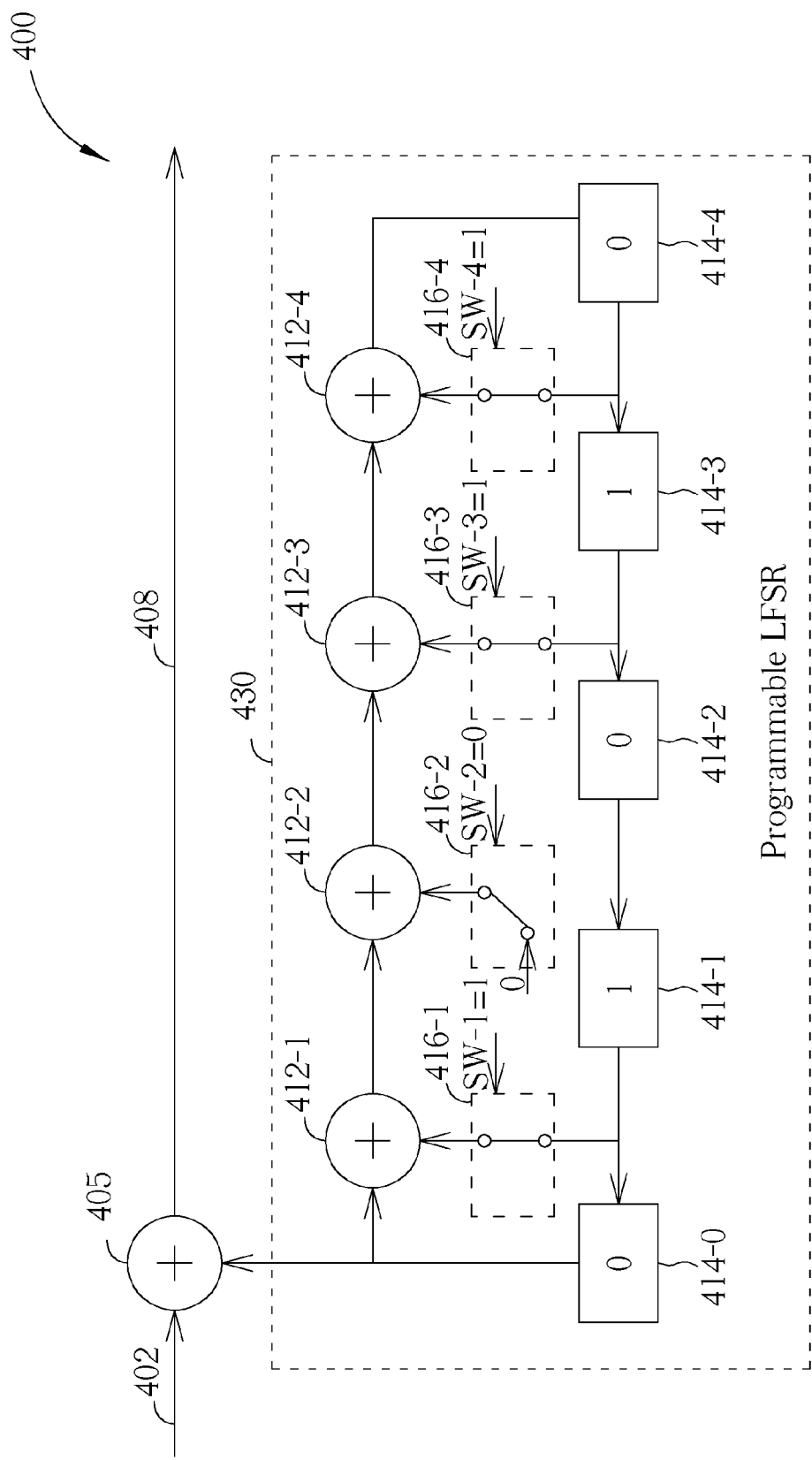

More specifically, by changing the key input into the programmable LFSR 410, the memory controller 110 can set one or more random function generator equations of the programmable LFSR 410 once and once again, where the one or more random function generator equations can be utilized for generating random functions. For example, the random function generator equation of the programmable LFSR 420 shown in FIG. 4B is $G_1$, and the random function sequence $S_1$ generated by the random function generator equation $G_1$ is "0000101011101100011111001101001". In a situation where the registers 424-0, 424-1, 424-2, 424-3, and 424-4 store a series of values {0, 1, 0, 0, 0} in an initial state, the programmable LFSR 420 outputs respective bits of the random function sequence $S_1$ according the order thereof, starting from the first bit "0" of the random function sequence $S_1$. When all bits (including the last bit "1") of the random function sequence $S_1$ have been output, the programmable LFSR 420 then outputs the first bit "0" of the random function sequence $S_1$ to repeat outputting the random function sequence $S_1$. The bit from which the programmable LFSR 420 starts to output the random function sequence $S_1$ is determined based upon the initial state of the registers 424-0, 424-1, 424-2, 424-3, and 424-4. For example, in a situation where the registers 424-0, 424-1, 424-2, 424-3, and 424-4 store a series of values {1, 1, 0, 1, 0} in an initial state, the programmable LFSR 420 outputs respective bits of the random function sequence $S_1$ according the order thereof, starting from the fifth bit "1" of the random function sequence $S_1$. In another embodiment, the random function generator equation of the programmable LFSR 430 shown in FIG. 4C is $G_2$, and the random function sequence $S_2$ generated by the random function generator equation $G_2$ is "00001101010010001011111101100111".

Thus, by inputting different keys into the programmable LFSR 410, the memory controller 110 can control the programmable LFSR 410 to generate different random functions, in order to increase the entropy of the pseudo-random bit sequence 1145, causing the adjusted version of the data pattern distribution mentioned in Step 914 to be more uniform. Please note that the number of respective components such as the registers, adders, switches, etc. shown in FIGS. 4A, 4B, and 4C is for illustrative purposes only, and is not meant to be a limitation of the present invention. According to different embodiments of the present invention, the number of registers and/or the number of adders can be adjusted when needed.

In another embodiment, in order to increase the entropy of the pseudo-random bit sequence 1145, the memory controller 110 can change the key to make the programmable LFSR 410 process a page of data within the encoded data bit sequence 1143 by utilizing a plurality of different random functions. For example, in a situation where a page of data within the encoded data bit sequence 1143 includes 512 kilobytes, given that each kilobyte represents 1024 bytes, the memory controller 110 sets the programmable LFSR 410 with a first key to make the randomizer 1144 process the $1^{st}$ through to the $31^{st}$ bits of the page of data within the encoded data bit sequence 1143 by utilizing the random function sequence $S_1$, and then the memory controller 110 sets the programmable LFSR 410 with a second key to make the randomizer 1144 process the $32^{nd}$ through to the $62^{nd}$ bits of the page of data within the encoded data bit sequence 1143 by utilizing the random function sequence $S_2$, and so on. As a result, the entropy of the pseudo-random bit sequence 1145 can be increased.

According to this embodiment, the programmable LFSR 410 can be applied to the randomizer 1144 or the derandomizer 1146 shown in FIG. 1. For example, when the numeral 400 represents the randomizer 1144, the bit sequences 402 and 408 represent the encoded data bit sequence 1143 and the pseudo-random bit sequence 1145, respectively. In another example, when the numeral 400 represents the derandomizer 1146, the bit sequences 402 and 408 represent the pseudo-random bit sequence 1145' and the recovered data bit sequence 1147, respectively. This is for illustrative purposes only, and is not meant to be a limitation of the present invention. According to a variation of this embodiment (e.g. the variation mentioned under the descriptions of Step 914), in a situation where the randomizer 1144 is installed outside the control logic 114, the programmable LFSR 410 represents the randomizer 1144, where the bit sequences 402 and 408 respectively represent the encoded data bit sequence 1143 and the pseudo-random bit sequence 1145, and the adder 405 is utilized for injecting the sequence of the first random function and adjusting the encoded data bit sequence 1143 accordingly. More particularly, the adder 405 can be a modulo 2 adder. According to another variation of this embodiment (e.g. the variation mentioned under the descriptions of Step 918), in a situation where the derandomizer 1146 is installed outside the control logic 114, the programmable LFSR 410 represents the derandomizer 1146, where the bit sequences 402 and 408 respectively represent the pseudo-random bit sequence 1145' and the recovered data bit sequence 1147, and the adder 405 is utilized for injecting the sequence of the second random function and adjusting the pseudo-random bit sequence 1145' accordingly.

According to another variation of this embodiment, the programmable LFSR 410 can be implemented by utilizing a software module within the program code 112C, and the memory controller 110 utilize the keys to change the random function generator equations of the programmable LFSR 410 that is implemented by utilizing the software module of the program code 112C, where the adder 405 is still installed within the control logic 114, and is utilized for injecting the sequence of the first random function or the sequence of the second random function and adjusting the bit sequence 402 accordingly. According to this variation or other variations of this embodiment, at least a portion of the randomizer 1144 can be implemented by utilizing the microprocessor 112 executing the program code 112C. Similarly, at least a portion of the derandomizer 1146 can also be implemented by utilizing the microprocessor 112 executing the program code 112C.

According to this embodiment, the generation method of the key is defined in the program code 112C, so the memory controller 110 that executes the program code 112C by utilizing the microprocessor 112 can determine the key. For example, the memory controller 110 can determine the key to be a certain key value, and some bits of the binary form of the key value respectively represent the turn-on/off states of the switching signals SW-n (n=1, 2, 3, or 4), where these bits of the key value can be the logical value 1 (which represents the turn-on state) or the logical value 0 (which represents the turn-off state). This is for illustrative purposes only, and is not meant to be a limitation of the present invention. According to a variation of this embodiment, the key value is a predetermined value having respective bits representing predetermined turn-on/off states. Please note that the number of bits can be determined based upon the number of switches.

According to another variation of this embodiment, the key varies in response to the input of the programmable LFSR 410. For example, the key comprises at least one block address or at least one page address, and more particularly, the logical address of the data represented by the bit sequence 402 or the physical address where it is/should be stored within the Flash memory 120. When the memory controller 110 determines a certain block address or a certain page address to be a key value of the key, some bits of the binary form of the block address or the page address can be utilized for setting the linear combination paths of the programmable LFSR 410 in real time in order to determine the random function generator equation thereof.

According to another variation of this embodiment, the key corresponds to at least one block address or at least one page address, and more particularly, the address of the data represented by the bit sequence 402. According to a calculation rule, the memory controller 110 can determine a key value corresponding to a certain block address or a certain page address, where some bits of the key value can be utilized for setting the linear combination paths of the programmable LFSR 410 in real time. For example, the calculation rule may comprise utilizing the odd bits (or the even bits) of the block address or the page address as the corresponding key value, or utilizing a portion of the block address or the page address as the corresponding key value.

According to another variation of this embodiment, the key corresponds to at least one block address or at least one page address, and more particularly, the logical address of the data represented by the bit sequence 402 or the physical address where it is/should be stored within the Flash memory 120. According to a look-up table, the memory controller 110 can look up a key value corresponding to a certain block address or a certain page address, where some bits of the key value can be utilized for setting the linear combination paths of the programmable LFSR 410 in real time.

Figure 5:
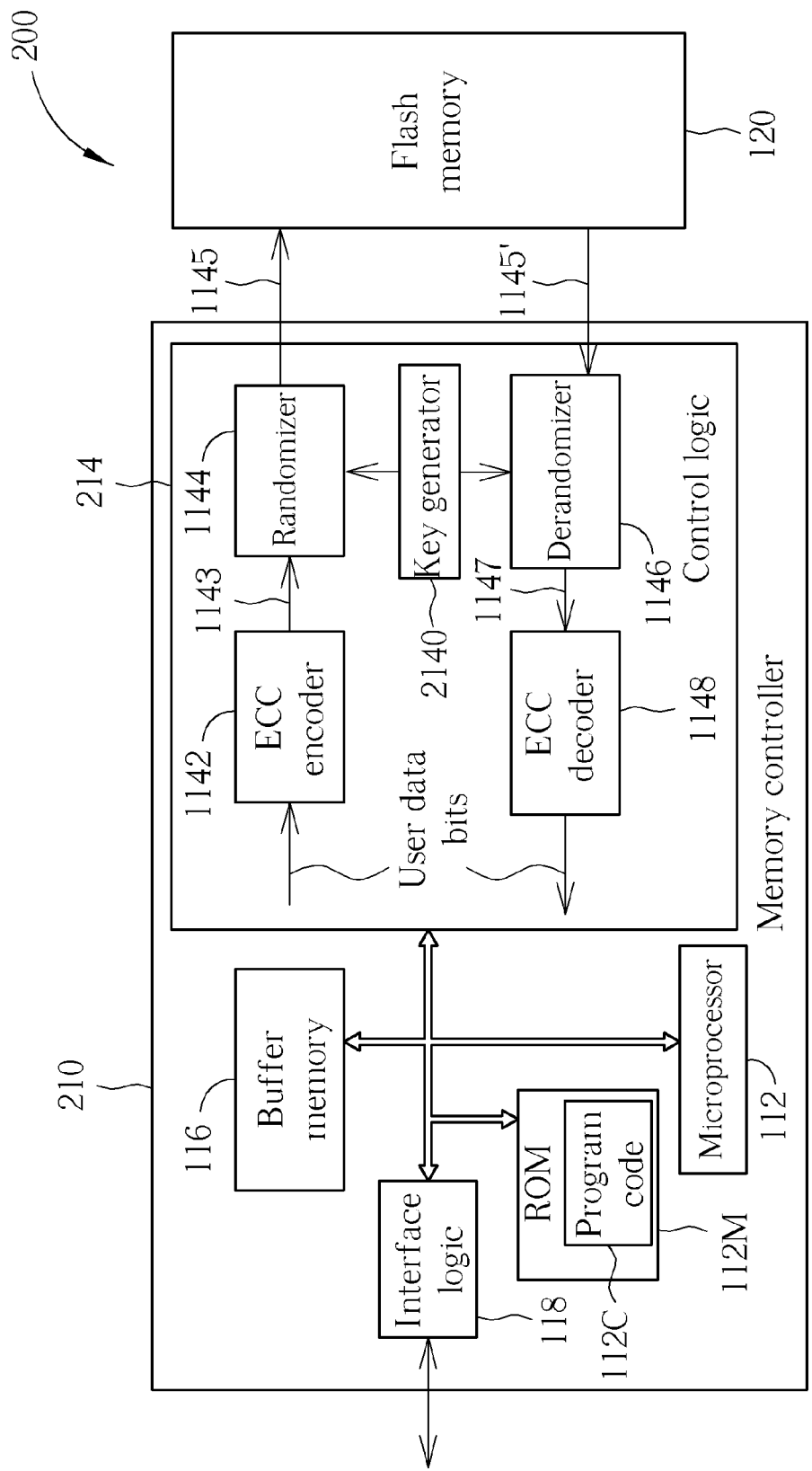
FIG. 5 is a diagram of a memory device according to a second embodiment of the present invention.

FIG. 5 is a diagram of a memory device 200 according to a second embodiment of the present invention, where this embodiment is a variation of the first embodiment. As shown in FIG. 5, the control logic 114 mentioned above is replaced by a control logic 214. In addition to the respective components of the control logic 114 shown in FIG. 1, the control logic 214 further comprises a key generator 2140. In response to the above change in architecture, the controller is referred to as the memory controller 210 in this embodiment.

Please note that the key generator 2140 of this embodiment can be utilized for replacing the generating mechanisms of the key in the respective embodiments/variations mentioned above, and more particularly, for replacing the generation method of the key as defined in the program code 112C, where the generation method of the key can be similar to those of the respective embodiments/variations mentioned above. For example, the key generator 2140 can generate a series of key values of the key by utilizing the aforementioned look-up table.

FIG. 6 illustrates the look-up table utilized by the key generator 2140 shown in FIG. 5 according to an embodiment of the present invention, where the left half of the look-up table may represent the at least one block address or at least one page address mentioned above, and the right half of the look-up table may represent the key values of the key. This is for illustrative purposes only, and is not meant to be a limitation of the present invention. According to a variation of this embodiment, based upon the look-up table or another look-up table, the key generator 2140 can set a series of key values temporarily stored in the registers 414-0, 414-1, 414-2, 414-3, and 414-4 in an initial state or another state.

According to another variation of this embodiment, in a situation where each of the randomizer 1144 and the derandomizer 1146 comprises a first programmable LFSR (for example, the implementation details thereof can be the same as the programmable LFSR 410 shown in FIG. 4A), the memory controller 110 utilizes a second programmable LFSR (for example, the implementation details thereof can be the same as the programmable LFSR 410 shown in FIG. 4A) as the key generator 2140, wherein the key generated by the key generator 2140 is input into the first programmable LFSR. Please note that one or more linear combination paths within the key generator 2140 of this variation can be directly conducted by using conductive wires according to predetermined path arrangement, so installing the switches 416-$n$ mentioned above is not required. The initial state of some registers of the second programmable LFSR may correspond to at least one block address or at least one page address, and more particularly, the logical address of the data represented by the bit sequence 402 or the physical address where it is/should be stored within the Flash memory 120, in order to increase the entropy thereof. Additionally, the second programmable LFSR can be implemented with architecture which is similar to that of the programmable LFSR 410 shown in FIG. 4A. Similar descriptions are not repeated in detail for this variation.

According to another variation of this embodiment, in a situation where the randomizer 1144 and the derandomizer 1146 may share the same first programmable LFSR, the memory controller 110 utilizes the second programmable LFSR as the key generator 2140, wherein the key generated by the key generator 2140 is input into the first programmable LFSR. Similar descriptions are not repeated in detail for this variation.

Those skilled in the art will readily observe that numerous modifications and alterations of the device and method may be made while retaining the teachings of the invention.

What is claimed is:

1. A method for performing data pattern management regarding data accessed by a controller of a Flash memory, the method comprising:
   when the controller receives a write command, generating a first random function, wherein the write command is utilized for instructing the controller to write the data into the Flash memory;
   adjusting a plurality of bits of the data bit by bit according to a sequence of the first random function to generate a pseudo-random bit sequence, and writing the pseudo-random bit sequence into the Flash memory to represent the data, whereby data pattern distribution of the data is adjusted;
   providing at least one Linear Feedback Shift Register (LFSR) within the controller;
   utilizing the at least one LFSR to generate at least one random function, wherein the at least one random function comprises the first random function;
   providing at least one switch within the at least one LFSR to form at least one programmable LFSR, wherein each switch of the programmable LFSR is installed on a linear combination path of the programmable LFSR; and
   inputting at least one key into the switch of the programmable LFSR, in order to utilize the at least one key to set linear combination path(s) of the programmable LFSR.

2. The method of claim 1, wherein the key varies in response to an input of the programmable LFSR.

3. The method of claim 2, wherein the key comprises at least one block address or at least one page address; or the key corresponds to at least one block address or at least one page address.

4. The method of claim 1, wherein the at least one programmable LFSR comprises a first programmable LFSR and a second programmable LFSR; and the method further comprises:
   utilizing the second programmable LFSR as a key generator; and
   inputting at least one key generated by the key generator into the first programmable LFSR.

5. A memory device, comprising:
   a Flash memory comprising a plurality of blocks; and
   a controller arranged to access the Flash memory and manage the plurality of blocks, and further perform data pattern management regarding data accessed by the controller itself, wherein the controller comprises:
      a randomizer arranged to generate a first random function when the controller receives a write command, wherein the write command is utilized for instructing the controller to write the data into the Flash memory; and
      at least one Linear Feedback Shift Register (LFSR) arranged to generate at least one random function; and the randomizer comprises one of the at least one LFSR;
   wherein the controller adjusts a plurality of bits of the data bit by bit according to a sequence of the first random function to generate a pseudo-random bit sequence, and writes the pseudo-random bit sequence into the Flash memory to represent the data, whereby data pattern distribution of the data is adjusted; the at least one LFSR comprises at least one switch to form at least one programmable LFSR; each switch of the programmable LFSR is installed on a linear combination path of the programmable LFSR; and the controller inputs at least one key into the switch of the programmable LFSR, in order to utilize the at least one key to set linear combination path(s) of the programmable LFSR.

6. The memory device of claim 5, wherein the key varies in response to an input of the programmable LFSR.

7. The memory device of claim 6, wherein the key comprises at least one block address or at least one page address; or the key corresponds to at least one block address or at least one page address.

8. The memory device of claim 5, wherein the at least one programmable LFSR comprises a first programmable LFSR and a second programmable LFSR; and the controller utilizes the second programmable LFSR as a key generator, wherein at least one key generated by the key generator is input into the first programmable LFSR.

9. A controller of a memory device, the controller being utilized for accessing a Flash memory comprising a plurality of blocks, the controller comprising:
   a read only memory (ROM) arranged to store a program code;
   a microprocessor arranged to execute the program code to control access to the Flash memory and manage the plurality of blocks; and
   a randomizer arranged to generate a first random function when the controller receives a write command, wherein the write command is utilized for instructing the controller to write data into the Flash memory;
   wherein the controller adjusts a plurality of bits of the data bit by bit according to a sequence of the first random function to generate a pseudo-random bit sequence, and writes the pseudo-random bit sequence into the Flash memory to represent the data, whereby data pattern distribution of the data is adjusted; the controller comprises at least one Linear Feedback Shift Register (LFSR) arranged to generate at least one random function; and the randomizer comprises one of the at least one LFSR; the at least one LFSR comprises at least one switch to form at least one programmable LFSR; each switch of the programmable LFSR is installed on a linear combination path of the programmable LFSR; and the controller inputs at least one key into the switch of the programmable LFSR, in order to utilize the at least one key to set linear combination path(s) of the programmable LFSR.

10. The controller of claim 9, wherein at least a portion of the randomizer is implemented by utilizing the microprocessor executing the program code.

* * * * *